United States Patent
Meyer (10) Patent No.: US 12,058,816 B2
(45) Date of Patent: Aug. 6, 2024

(54) METHOD FOR PRODUCING A METAL-CERAMIC SUBSTRATE, AND METAL-CERAMIC SUBSTRATE PRODUCED USING SUCH A METHOD

(71) Applicant: Rogers Germany GmbH, Eschenbach (DE)

(72) Inventor: Andreas Meyer, Speichersdorf (DE)

(73) Assignee: ROGERS GERMANY GMBH, Eschenbach (DE)

( * ) Notice: Subject to any disclaimer, the term of this patent is extended or adjusted under 35 U.S.C. 154(b) by 445 days.

(21) Appl. No.: 17/609,572

(22) PCT Filed: May 13, 2020

(86) PCT No.: PCT/EP2020/063262
§ 371 (c)(1),
(2) Date: Nov. 8, 2021

(87) PCT Pub. No.: WO2020/234067
PCT Pub. Date: Nov. 26, 2020

(65) Prior Publication Data
US 2022/0295641 A1    Sep. 15, 2022

(30) Foreign Application Priority Data
May 20, 2019   (DE) .................... 10 2019 113 308.4

(51) Int. Cl.
*H05K 3/02* (2006.01)
*B23K 1/00* (2006.01)
(Continued)

(52) U.S. Cl.
CPC ........... *H05K 3/022* (2013.01); *B23K 1/0016* (2013.01); *C04B 37/021* (2013.01); *H05K 1/11* (2013.01);
(Continued)

(58) Field of Classification Search
None
See application file for complete search history.

(56) References Cited

U.S. PATENT DOCUMENTS 4,500,029 A    2/1985  Yerman
5,363,278 A *  11/1994 Komorita .......... H01L 23/49866
                                              156/87
(Continued)

FOREIGN PATENT DOCUMENTS

CN    103889146 A    6/2014
DE    2508224 C3     2/1975
(Continued)

OTHER PUBLICATIONS

International Preliminary Report on Patentability for International Application No. PCT/EP2020/063262, International Filing Date May 13, 2020, Date of Mailing Nov. 25, 2021, 6 pages.

*Primary Examiner* — Roberts P Culbert
(74) *Attorney, Agent, or Firm* — CANTOR COLBURN LLP (57) ABSTRACT

Method of manufacturing a metal-ceramic substrate (1) which, in the finished state, has a ceramic layer (11) and a metal layer (12) extending along a main extension plane (HSE) and arranged one above the other along a stacking direction (S) extending perpendicularly to the main extension plane (HSE) comprising providing the metal layer (12) and the ceramic layer (11) and bonding the metal layer (12) to the ceramic layer (11) in regions to form a first region (B1), which has a materially bonded connection between the metal layer (12) and the ceramic layer (11), and a second region (B2), in which the metal layer (12) and the ceramic layer (11) are arranged one above the other without a materially bonded connection, as seen in the stacking direction (S).

9 Claims, 4 Drawing Sheets

(51) Int. Cl.
*C04B 37/02* (2006.01)
*H05K 1/11* (2006.01)
*H05K 3/00* (2006.01)
*H05K 3/38* (2006.01)
*B23K 101/42* (2006.01)

(52) U.S. Cl.
CPC ........... *H05K 3/0044* (2013.01); *H05K 3/388* (2013.01); *B23K 2101/42* (2018.08); *C04B 2237/40* (2013.01); *H05K 2201/1034* (2013.01); *H05K 2203/0369* (2013.01)

(56) References Cited

U.S. PATENT DOCUMENTS

| | | | |
|---|---|---|---|
| 5,938,104 A | 8/1999 | Saxelby, Jr. et al. |
| 6,261,703 B1 | 7/2001 | Sasaki et al. |
| 6,715,203 B2 | 4/2004 | Stolze et al. |

FOREIGN PATENT DOCUMENTS

| | | | |
|---|---|---|---|
| DE | 4318463 | C3 | 6/1993 |
| DE | 19927046 | A1 | 12/2000 |
| DE | 102007030389 | A1 | 10/2008 |
| DE | 101009033029 | A1 | 11/2011 |
| DE | 102013104739 | A1 | 9/2014 |
| EP | 1039539 | B1 | 7/2012 |
| GB | 1494951 | A | 12/1977 |
| JP | 2004247512 | A | 9/2004 |
| WO | 2014008891 | A2 | 1/2014 |
| WO | 2018114884 | A1 | 6/2018 |

\* cited by examiner

METHOD FOR PRODUCING A METAL-CERAMIC SUBSTRATE, AND METAL-CERAMIC SUBSTRATE PRODUCED USING SUCH A METHOD

CROSS-REFERENCE TO RELATED APPLICATIONS

This application is a National Stage filing of PCT/EP2020/063262, filed May 13, 2020, which claims priority to DE 10 2019 113 308.4, filed May 20, 2019, both of which are incorporated by reference in their entirety herein.

BACKGROUND

The present invention relates to a method of making a metal-ceramic substrate and to a metal-ceramic substrate made by such a method.

Metal-ceramic substrates are sufficiently known from the prior art, for example as printed circuit boards or circuit boards, for example from DE 10 2013 104 739 A1, DE 19 927 046 B4 and DE 10 2009 033 029 A1. Typically, connection pads for electrical components and conductor tracks are arranged on one component side of the metal-ceramic substrate, wherein the electrical components and the conductor tracks can be interconnected to form electrical circuits. Essential components of the metal-ceramic substrates are an insulation layer, which is preferably made of a ceramic, and a metal layer bonded to the insulation layer. Due to their relatively high insulation strengths, insulation layers made of ceramics have proven to be particularly advantageous in power electronics. Conductor tracks and/or connection regions for the electrical components can be realized by structuring the metal layer.

In particular, the present application relates to metal-ceramic substrates on which at least one metal section is provided which projects in a direction parallel to the main extension plane with respect to the ceramic layer, in particular its outermost edge, and thereby provides a lateral connection or terminal for the metal-ceramic substrate.

For the production of such terminals according to the prior art, terminal regions are realized mechanically after structuring of the metal layer by peeling off the metal layer already bonded to the ceramic layer. As a result, only relatively small terminals can be produced. In addition, a considerable amount of force is required and the yield of functional metal-ceramic substrates with the desired terminal is relatively low.

Alternatively, it is known from the prior art to realize terminals using a so-called strip technique. However, in this case no metal-ceramic substrates are produced in a large card format, but metal layers, which are wider than the ceramic layer, are bonded to individual ceramic sections. However, such production is difficult to automate and is not efficient.

SUMMARY

Based on this prior art, it is an object of the present invention to provide a method which is improved compared to the prior art and by means of which metal-ceramic substrates having a metal section projecting laterally beyond the ceramic layer can be realized, in particular with respect to improved efficiency and yield in the production of such metal-ceramic substrates.

This object is solved by a method for producing a metal-ceramic substrate according to claim 1 and a metal-ceramic substrate produced by such a method according to claim 10. Further advantages and properties result from the subclaims as well as the description and the attached figures.

It is a first aspect of the present invention to provide a method of manufacturing a metal-ceramic substrate having, as manufactured, a ceramic layer and a metal layer extending along a main extension plane which are arranged one above the other along a stacking direction perpendicular to the main extension plane, comprising
  providing the metal layer and the ceramic layer and
  bonding the metal layer to the ceramic layer region by region to form a first region, which has a materially bonded connection between the metal layer and the ceramic layer, and a second region, in which the metal layer and the ceramic layer are arranged one above the other without a materially bonded connection, viewed in the stacking direction, the second region being provided at least in regions as a connecting surface and/or as a terminal. Preferably, the method comprises the steps of:
separating the ceramic layer in the second region at a first distance from the first region, which distance is dimensioned parallel to the main extension plane, and
separating the metal layer in the second region at a second distance from the first region, which distance is dimensioned parallel to the main extension plane.

BRIEF DESCRIPTION OF THE FIGURES

Further advantages and features result from the following description of embodiments with reference to the attached figures. Individual features of the individual embodiment can thereby be combined with each other within the scope of the invention, which show, in.

DETAILED DESCRIPTION

In contrast to the methods known in the prior art, the invention does not involve peeling off the metal layer to form a laterally projecting terminal or a so-called strip technique. Instead, according to the invention, a materially bonded connection between the metal layer and the ceramic layer in the bonding method in a second region is dispensed with, so that a corresponding separation of the metal layer on one side and the ceramic layer on the other side can be used to allow the ceramic layer and the metal layer to extend to different degrees from the first region along a direction parallel to the main extension plane MEP. In particular, this allows the outermost region of the metal layer to provide a metal section which can be used as a lateral terminal or connection, preferably projecting beyond an edge of the ceramic layer in a direction parallel to the main extension plane. However, it is also provided that the metal section providing the outermost region of the metal layer is flush with the edge of the ceramic layer or is even recessed with respect thereto, i.e. the ceramic layer projects with respect to the metal layer. By a subsequent bending, in particular upward bending, of the metal section, it is advantageously possible to provide lateral terminals which project transversely to the main extension plane.

Preferably, the method comprises the steps of:
separating the ceramic layer in the second region at a first distance from the first region dimensioned parallel to the main extension plane, or
separating the metal layer in the second region at a second distance from the first region dimensioned parallel to the main extension plane.

Alternatively, it is conceivable that the second region relates to an inner metal region of the metal layer, in particular without separating the metal layer in the second region. By avoiding a materially bonded connection in the second region, a kind of bridge is formed between individual first regions, wherein the second region in this shape has proved to be particularly advantageous for the formation as a connection surface for electronic components, since thereby a mechanical decoupling in regions between metal layer and ceramic layer is possible, with which, in particular with individual connection methods, such as friction welding, the probability of otherwise occurring damage to the metal-ceramic substrate can be reduced. In this regard, the second region may preferably be completely enclosed. Alternatively, the interior second region comprises an opening, for example realized by etching, allowing a bending up or upward of a partial region of the second region, whereby a terminal projecting transversely with respect to the main extension plane, in particular in the interior metal region, can be realized.

In particular, an interior metal region is understood to be such a section which is adjoined by metal of the metal layer in all directions parallel to the main extension plane. Thus, the inner metal region is not an edge region of the metal layer comprising an outer edge of the metal layer.

Furthermore, it is preferably provided that the second region is not formed by a lifting or peeling of the metal layer from the ceramic element after the metal layer is bonded to the ceramic element. In other words, the second region without a materially bonded connection is formed without a peeling off or lifting off, i.e. without a tensile force acting on the metal layer and/or ceramic layer. In particular, it is provided that the second region is formed temporally before the metal layer and/or the ceramic layer is cut open and/or temporally before the metal layer is formed.

Preferably, the manufactured metal-ceramic substrate has a second region. In other words, there is preferably at least one partial section in the fabricated metal-ceramic substrate in which, viewed in the stacking direction, a section of the metal layer is arranged above the ceramic layer without this section forming a materially bonded connection with the ceramic layer. This section is then used as a terminal.

Furthermore, it is preferably provided that simultaneously with the cutting open of the metal layer in the second region, a structuring of the metal layer is carried out. This proves to be advantageous in particular because, due to the lack of a materially bonded connection, a so-called 'second etching' can be dispensed with in this case, which would otherwise be necessary in order to remove a bonding layer between the ceramic layer and the metal layer. In a corresponding manner, a structuring effort is reduced, in particular for second regions which are arranged within the metal layer. In this context, structuring is to be understood in particular as the formation of metal sections in the metal layer or the formation of an edge profile of the metal layer. In particular, the structuring takes place in the second region.

Preferably, it is provided that when the metal layer is bonded to the ceramic layer in regions, the metal layer is unstructured. In this context, 'unstructured' is to be understood to mean that the metal layer essentially does not comprise any severed regions or free regions (free regions passing through the metal layer), in particular for forming individual metal sections. Thus, unstructured is also understood to mean a metal layer which has a recessed course on the upper and/or lower side, provided that no free region is let into the metal layer. Furthermore, by unstructured it is preferably meant that edge courses of the metal layer at the respective sides run in a straight line, i.e. without protrusions or recesses in a direction running parallel to the main extension plane. In other words, when bonded, the metal layer preferably has a closed and substantially rectangular surface on its upper side, i.e. on its side facing away from the ceramic layer.

Conceivable materials for the further metallization layer on the outside of the encapsulation and/or the metallization layer of the carrier substrate are copper, aluminum, molybdenum and/or alloys thereof, as well as laminates such as CuW, CuMo, CuAl, AlCu and/or CuCu, in particular a copper sandwich structure with a first copper layer and a second copper layer, wherein a grain size in the first copper layer differs from a second copper layer. Furthermore, it is preferably provided that the metallization layer on the outer side and/or the metallization layer of the carrier substrate are surface modified. A conceivable surface modification is, for example, sealing with a noble metal, in particular silver and/or gold, or ENIG ('electroless nickel immersion gold') or edge encapsulation on the first or second metallization layer to suppress crack formation or expansion.

Preferably, the ceramic layer comprises $Al_2O_3$, $Si_3N_4$, AlN, a HPSX ceramic (i.e. a ceramic with an $Al_2O_3$ matrix comprising an x-percentage of $ZrO_2$, for example $Al_2O_3$ with 9% $ZrO_2$=HPS9 or $Al_2O_3$ with 25% $ZrO_2$=HPS25), SiC, BeO, MgO, high-density MgO (>90% of the theoretical density), TSZ (tetragonally stabilized zirconium oxide) or ZTA as material for the ceramic. In this context, it is also conceivable that the insulating layer is formed as a composite or hybrid ceramic, in which, in order to combine various desired properties, a plurality of ceramic layers, each of which differs in terms of its material composition, are arranged one above the other and are joined together to form an insulating layer. Preferably, a highly thermally conductive ceramic is used for the lowest possible thermal resistance.

For this purpose, the metal layer is preferably bonded to the insulating layer by means of an AMB process and/or a DCB process.

By a DCB process' (direct copper bond technology) or a 'DAB process' (direct aluminium bond technology) the skilled person understands such a process which serves, for example, to bond metal layers or sheets (e.g. copper sheets or foils or aluminium sheets or foils) to one another and/or to ceramics or ceramic layers, namely using metal or copper sheets or metal or copper foils which have a layer or a coating (fusion layer) on their surface sides. In this process, which is described for example in U.S. Pat. No. 3,744,120 A or in DE23 19 854 C2, this layer or coating (fusion layer) forms a eutectic with a melting temperature below the melting temperature of the metal (e.g. copper), so that by placing the foil on the ceramic and by heating all layers, these can be bonded to one another, namely by melting the metal or copper essentially only in the region of the fusion layer or oxide layer.

In particular, the DCB process then has, for example, the following process steps:

oxidizing a copper foil so that a uniform copper oxide layer is formed;

laying the copper foil on the ceramic layer;

heating the composite to a process temperature between about 1025 to 1083° C., e.g. to about 1071° C.;

cool to room temperature.

An active soldering process, e.g. for bonding metal layers or metal foils, in particular also copper layers or copper foils with ceramic material, has to be understood to mean a process which is also used in particular for the production of metal-ceramic substrates, a bond is produced between a metal foil, for example copper foil, and a ceramic substrate, for example aluminium nitride ceramic, at a temperature between approximately 650-1000° C. using a hard solder which, in addition to a main component such as copper, silver and/or gold, also contains an active metal. This active metal, which is for example at least one element of the group Hf, Ti, Zr, Nb, Ce, establishes a connection between the brazing alloy and the ceramic by chemical reaction, while the connection between the brazing alloy and the metal is a metallic brazing connection. Alternatively, a thick film process is conceivable for bonding.

In principle, it is conceivable that the metal section at the outermost edge of the metal layer is bent upwards and/or oriented in a preferred orientation after it has been produced. However, it is particularly preferred that the metal section continues the course of the metal layer along the main extension plane MEP, and thus projects laterally with respect to the ceramic layer. For example, it is conceivable that the second region is obtained during a bonding process by the metal layer being only partially oxidized on a top and/or bottom side prior to performing the bonding process. As a result, for example, regions remain free of oxidation, preferably by means of a corresponding masking, which is required in the bonding process for the formation of a eutectic and thus for the bonding between the metal layer and the ceramic layer. Furthermore, it is preferably provided that the second region is arranged at least between two first regions.

According to a preferred embodiment of the present invention, in order to form a metal section which, in the manufactured state, projects with respect to the ceramic layer in a direction parallel to the main extension plane for forming a connection or terminal, it is provided that the second distance is greater than the first distance. Thus, it is advantageously possible to provide a lateral terminal projecting with respect to the outermost periphery of the ceramic layer, which can serve as an electrical terminal for the metal-ceramic substrate. In particular, it is provided that a ratio between the first distance and the second distance assumes a value between 0.01 and 0.1, preferably between 0.015 and 0.05 and, particularly preferably, between 0.01 and 0.04. Preferably, the first distance assumes a value smaller than 1.5 mm, preferably between 0.1 and 0.8 mm and particularly preferably between 0.3 and 0.6 mm and/or the second distance assumes a value between 3 and 50 mm, preferably between 4 and 20 mm and particularly preferably between 5 and 15 mm. Accordingly, it is thereby possible to provide relatively widely projecting terminals which would not be realizable, for example, with the conventional mechanical pull-off methods of the prior art. In particular, such long terminals permit flexible adaptation to the respective application of the manufactured metal-ceramic substrate and also permit, for example, complete encapsulation of the manufactured metal-ceramic substrate in a housing, from which the manufactured metal section can projects laterally as a terminal.

In a preferred embodiment of the present invention, it is provided that a third distance between the metal layer and the ceramic layer in the second region, dimensioned perpendicular to the main extension plane MEP, is realized prior to the bonding process. This ensures that the corresponding third distance between the ceramic layer and the metal layer prevents a connection or bonding in the later second region during the bonding process, and thus the second region is realized. Preferably, it is provided that a ratio of a third distance to a thickness of the metal layer dimensioned along the stacking direction assumes a value between 0.05 and 0.7, preferably between 0.1 and 0.45 and, particularly preferably between 0.15 and 0.35. It is further provided that the third distance assumes a value between 10 and 500 μm, preferably between 10 and 150 μm and more preferably between 10 and 80 μm. On the other hand, the metal layer preferably has a thickness of between 200 and 1000 μm, preferably between 200 and 600 μm and particularly preferably between 200 and 400 μm. This ensures, on the one hand, that there is sufficient spacing of the metal layer in the second region and, at the same time, provides a sufficient thickness for the metal layer to be suitable as a functional terminal.

More suitably, it is preferably provided that the third distance is realized by etching prior to joining the metal layer and the ceramic layer. In particular, the third spacing is defined by an etching depth realized during an etching process. In particular, the skilled person understands an etching process to be such an etching process that is controlled and interrupted before the metal layer is etched through. In particular, the etching process is controlled so as to realize a recess in the metal layer with an etching depth which then corresponds to the subsequent third distance when the metal layer is placed on the ceramic layer, before the bonding takes place, in particular via a DCB process.

It is further conceivable that the third section is provided by patterning or etching in the ceramic layer. In this case, it may be possible to dispense with a corresponding etching in the metal layer. Such an approach proves to be particularly advantageous for ceramic layers having a relatively large thickness dimensioned in the stacking direction, and/or such metal-ceramic substrates which are to have a relatively small metal layer thickness in the first region of the manufactured process.

Furthermore, it is preferably provided that the third distance between the metal layer and the ceramic layer is realized by a buffer layer and/or an active solder or a solder material. In particular, in the case of manufacture by means of an active solder material, the bonding of the metal layer to the ceramic layer is carried out by means of a soldering process. In this case, it is necessary that the solder material is only partially applied to the ceramic layer and/or the metal layer before the soldering process. In particular, it is ensured by means of an appropriate masking that the solder material is applied only in targeted regions which later form the first regions. Alternatively, it is conceivable that instead of an active solder material or solder material, a buffer layer is selectively applied, the buffer layer preferably comprising a powder mixture comprising ceramic particles and/or glass particles and metal particles. In particular, the powder is a powder comprising composite or bonded particles in which the particles of ceramic and the particles on metal are welded, fused or joined together by a corresponding pretreatment to form a mixed particle. Preferably, a corresponding buffer material or material for the buffer layer is produced by mechanofusion. By means of such a buffer layer, an appropriate equalization of the thermal expansion coefficients between the ceramic layer and the metal layer can additionally be provided, and at the same time an adequate spacing between the metal layer and the ceramic layer, i.e. for the third distance. In a further embodiment, it is provided that the active solder material for forming the first region and second region is only partially applied to the metal layer and/or ceramic layer.

Preferably, it is provided that a predetermined breaking point is realized for separating the ceramic layer. For example, this predetermined breaking point is realized in the second region by means of a laser treatment or laser radiation. However, it is also conceivable that such a predetermined breaking point is completed by a mechanical process, such as scribing and/or milling and/or etching. The predetermined breaking point, which may extend continuously and/or intermittently along a direction, thus defines the first distance between the first region and the point of separation of the ceramic layer. Preferably, the ceramic layer is thus broken or broken off for separating it. In this way, a specific setting of the first section can be realized in an advantageous manner for the separating the ceramic layer.

In a further embodiment, it is provided that an etching process is used to separate the metal layer. For this purpose, preferably a renewed resist layer is applied to the metal layer already bonded to the ceramic layer, and in contrast to etching, which is used to form the third distance, the metal layer is then etched through completely, so that the metal layer is separated. In this way, the second distance for the separation of the metal layer in the second region can be specifically defined.

In another embodiment of the present invention, it is provided that the metal-ceramic substrate is a large card. In particular, it is provided that the metal-ceramic substrates with the terminals are manufactured in a large card form, and a plurality of individual metal-ceramic substrates with respective terminals are provided by appropriately separating them from each other. In other words, fabrication as a large card enables multiple use fabrication. A corresponding process proves to be advantageous in particular compared to the strip technique known in the prior art, which are relatively costly to automate. In particular, several metal-ceramic substrates with terminals can be produced simultaneously, which are formed by separating the metal layer and the ceramic layer.

A further aspect of the present invention is a metal-ceramic substrate produced by the method according to the invention, wherein the metal layer in the second region is in particular smaller than in the first region. All properties and advantages described for the method apply analogously to the metal-ceramic substrate and vice versa.

Preferably, the fabricated metal-ceramic substrate comprises a second region, i.e., there is a partial region in the fabricated metal-ceramic substrate in which the metal layer and the ceramic layer are arranged one above the other, as viewed in the stacking direction, without a materially bonded connection to one another. Further advantages and features result from the following description of preferred embodiments of the subject-matter according to the invention with reference to the attached figures. Individual features of the individual embodiments can be combined with one another within the scope of the invention.

FIGS. 1a to 1g schematically illustrate a method of manufacturing a metal-ceramic substrate 1 according to a first preferred embodiment of the present invention. Such a metal-ceramic substrate 1 preferably serves in each case as a carrier of electronic or electrical components which can be connected to the metal-ceramic substrate 1. Essential components of such a metal-ceramic substrate 1 are a ceramic layer 11 extending along a main extension plane HSE, and a metal layer 12 bonded to the ceramic layer 11. The ceramic layer 11 is made of at least one material comprising a ceramic. In this case, the metal layer 12 and the ceramic layer 11 are arranged one above the other along a stacking direction S extending perpendicularly to the main extension plane HSE and, in a manufactured state, are materially bonded to one another at least in regions via a connecting surface A. Preferably, the metal layer 12 is then structured to form conductor paths or connection points for the electrical components. For example, this structuring is etched into the metal layer 12. In advance, however, a permanent bond, in particular a materially bonded connection, must be formed between the metal layer 12 and the ceramic layer 11.

In order to permanently bond the metal layer 12 to the ceramic layer 11, a system for manufacturing the metal-ceramic substrate 1, in particular in a DCB or DAB-bonding process, comprises a furnace in which a stacked assembly of a ceramic layer 11 and at least one metal layer 12 is heated, thereby achieving the bond. For example, the metal layer 12 is a metal layer 12 made of copper, wherein the metal layer 12 and the ceramic layer 11 are bonded together using a DCB (direct copper bonding) bonding process.

In particular, the method concerns the production of metal-ceramic substrates 1 having a laterally or laterally protruding connection or terminal 5. By a terminal 5 is meant in particular a metal section which projects beyond an edge side, in particular an outermost edge side, of the ceramic layer 11 in a direction running parallel to the main extension plane HSE and thus projects with respect to the ceramic layer 11 in a direction running parallel to the main extension plane HSE. Such a laterally or laterally protruding metal section forms a connection or terminal 5, via which the metal layer 12 can be electrically contacted. For this purpose, it is particularly provided that the metal section is part of the metal layer 12 which is directly connected to one side of the ceramic layer 11 via the connecting surface A. To form such metal-ceramic substrates 1, a metal layer 12 is first provided. In the method illustrated in FIGS. 1a to 1g, it is therein provided that a resist layer 18 is at least partially applied to the metal layer 12, in particular to an upper and/or lower side of the metal layer 12. In particular, it is provided that the resist layer 18 is applied to the upper and/or lower side in regions, so that at least a partial section on the lower and/or upper side of the metal layer 12 remains free of the resist layer 18. In the embodiment example shown in FIG. 1b, the upper side of the metal layer 12 is completely covered with the resist layer 18, while on the lower side the resist layer 18 is applied in such a way that in a central region, i.e. between two partial regions with resist layer 18, there is a partial region free of the resist layer 18. Such resist layers 18 serve to prevent etching from taking place in the regions covered by the resist layer 18 during an etching process with an etchant.

Figure 1A:
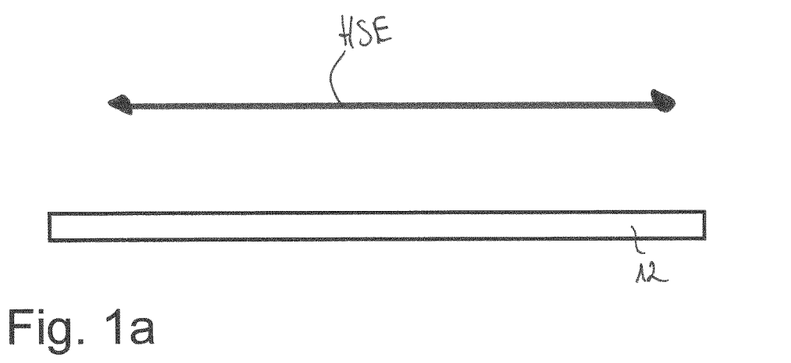
FIGS. 1a, 1b, 1c, 1d, 1e, 1f, and 1g: schematically, a method of manufacturing a metal-ceramic substrate according to a first preferred embodiment of the present invention.
Figure 1B:
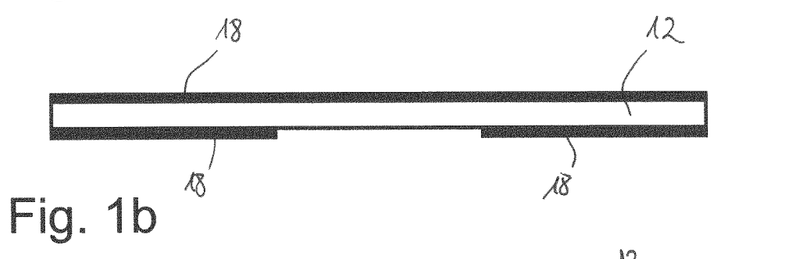
Figures 1C, 1D, 1E:
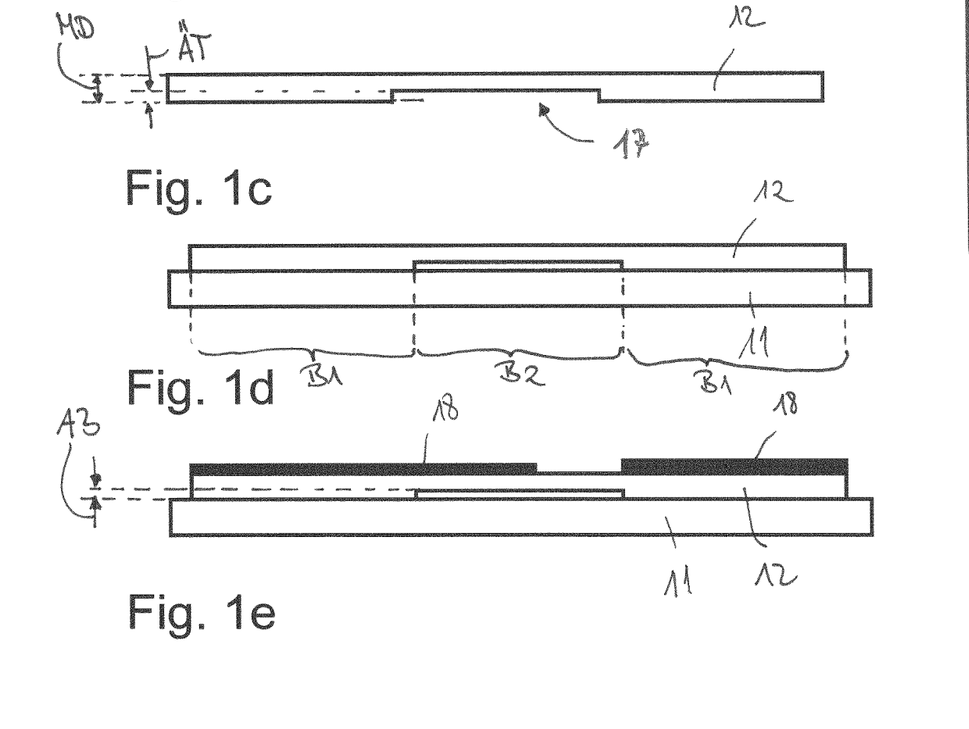

In contrast to the regions covered with the resist layer 18, the regions that are free of the resist layer are etched in an etching step. In particular, an etching step is provided in this case, i.e. the etching is configured or adjusted such that the etching process is stopped or interrupted before the metal layer 12 is completely penetrated by the etching process in a direction parallel to the stacking direction S. In particular, it is provided that the etching process is set such that the etching process is stopped as soon as a recess 17 having an etching depth ÄT on the bottom side is formed, wherein the etching depth ÄT, in particular the etching depth ÄT dimensioned in the stacking direction S, is smaller than a metal layer thickness MD dimensioned in the stacking direction S.

Preferably, it is provided that a ratio of the metal layer thickness MD, in particular measured in one of the regions previously covered with the resist layer 18, to an etching depth ÄT assumes a value between 1.5 and 15, preferably between 2 and 10 and, more preferably, between 2.5 and 7. In this way, on the one hand, a sufficient depth for the recess 17 is realized and, at the same time, a sufficient thickness of the later metal section which forms the laterally protruding terminal 5 in the finished product.

In particular, it is provided that following the etching process or etching, the metal layer 12 is bonded to the ceramic layer 11, in particular by means of a metal direct bonding process. Therein, it is provided that the side having the recess 17, or the upper and lower sides of the metal layer 12, faces the ceramic layer 11, that is to say, a cavity is formed between the metal layer 12 and the ceramic layer 11 in a second region B2, in which the metal layer 12 is spaced apart from the ceramic layer 11 by a third distance A3. During the bonding process, in which the metal layer 12 is bonded to the ceramic layer 11, first regions B1 are thus formed in which the metal layer 12 is materially bonded to the ceramic layer 11, in particular via a connecting surface A. In particular, a second region B2 is then formed between two first regions B1 in which the metal layer 12 and the ceramic layer 11 are arranged one above the other without a materially bonded connection, as viewed in the stacking direction S. In other words, in the second region B2, there is no bonding of the metal layer 12 to the ceramic layer 11, in particular caused by the course of the upper and lower sides shown in FIG. 1b with the recess 17, which ensures sufficient spacing of the metal layer 12 from the ceramic layer 11.

After bonding the metal layer 12 to the ceramic layer 11, it is provided that a resist layer 18 is again applied to the upper surface of the metal layer 12. In particular, it is provided that in this case the resist layer 18 is applied in such a way that it is interrupted at the upper surface. In this case, such an interruption is provided in the second region B2. By etching after the application of the resist layer 18, it is then possible to separate the metal layer 12 in the second region B2 from the first region B1 at a second distance A2 dimensioned parallel to the main extension plane HSE. In this regard, it is particularly provided that the second distance A2, and thus the length of the later terminal 5 along the main extension plane HSE, is determined by the arrangement of the resist layer 18 in the preceding step.

Figure 1F:
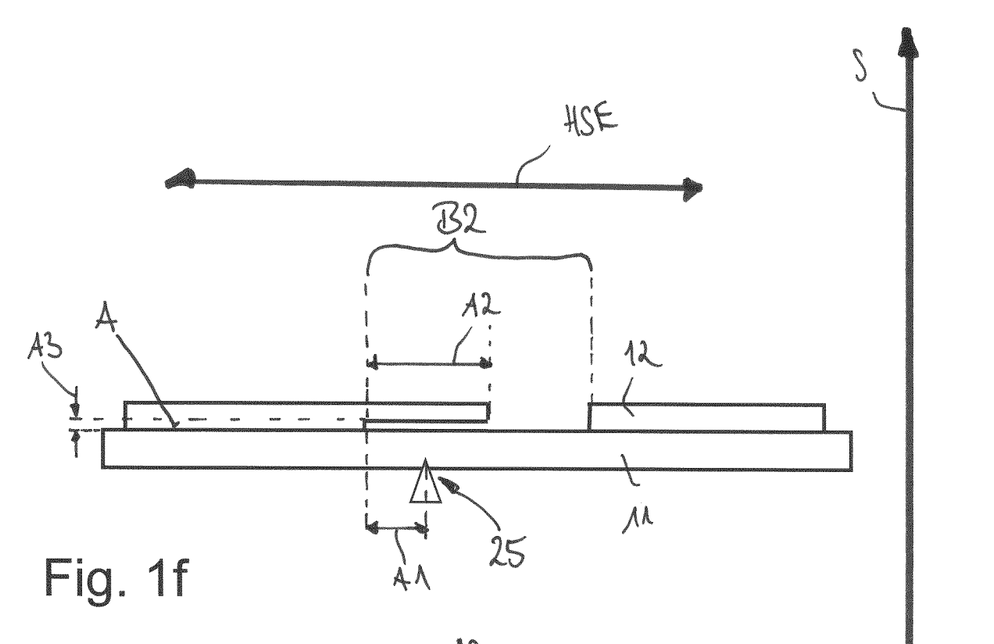
Figure 1G:
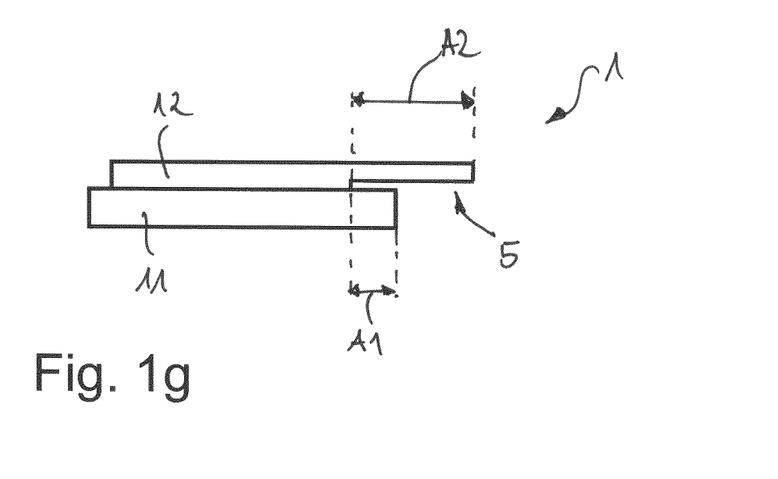

In particular, this proves to be advantageous in that it allows relatively long terminals 5 to be produced. In particular, in comparison with such terminals 5 which, as is usual in the prior art, are formed by a mechanical peeling. Finally, it is provided that after the metal layer 12 has been separated, a predetermined breaking point 25 is realized in the second region B2 in the ceramic layer 11 (FIG. 1f). In particular, the predetermined breaking point 25 is arranged at a first distance A1 from the first region B1 in a direction parallel to the main extension plane HSE. By separating, in particular breaking or fracturing the ceramic layer 11 at the predetermined breaking point 25, the ceramic layer 11 is separated at a first distance A1 from the first region B1. In particular, it is provided that the first distance A1 is smaller than the second distance A2, so that a metal section protruding with respect to the edge of the ceramic layer 11 is formed in the metal layer 12, which is suitable as a connection or terminal 5. Thus, a metal-ceramic substrate 1 with laterally projecting terminal 5 is realized in a simple and production-safe manner.

FIGS. 2a to 2g illustrate a method according to another preferred embodiment of the present invention. In particular, the method shown in FIGS. 2a to 2g differs from the method shown in FIGS. 1a to 1g in that a solder material 19 is provided for bonding the metal layer 12. Accordingly, it is provided that in a first step, the metal layer 11 and the ceramic layer 12 are provided. Subsequently, a solder material 19 is applied in regions to the ceramic layer 12. In particular, this is applied in such a way that between two regions with solder coating or material 19 there is arranged a region which is free of a solder material 19. Subsequently, the ceramic layer 11 and the metal layer 12 are arranged one above the other as seen in the stacking direction S, in particular in such a way that the metal layer 12 and the ceramic layer 11 are in connection via the solder material 19, and the region without solder material 19 which remains free between the solder layers of the solder material 19 ensures a sufficient spacing (i.e. third distance A3) between the metal layer 12 and the ceramic layer 11, so that in the case of active soldering via the solder material 19 no connection is realized in the second region B2 of the produced metal-ceramic substrate 1.

Alternatively to forming or bonding the metal layer 12 over the ceramic layer 11 via a spaced solder material 19, it is also conceivable that a buffer layer is used instead of the solder material 19, wherein a bond is formed via this buffer layer during a direct metal bonding process, in particular a DCB process.

Figure 2A:
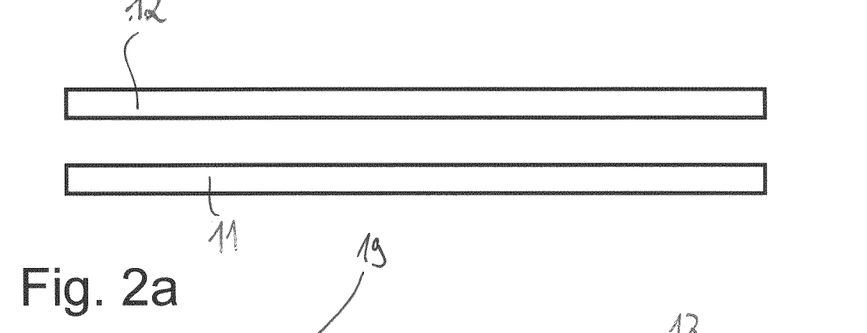
FIG. 2a, 2b, 2c, 2d, 2e, 2f, and 2g: schematically, a method of manufacturing a metal-ceramic substrate according to a second preferred embodiment of the present invention.
Figure 2B:
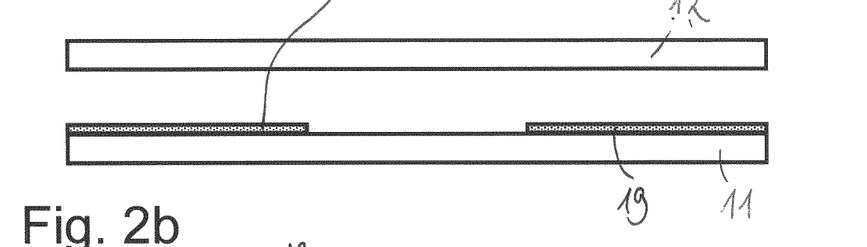
Figures 2C, 2D:
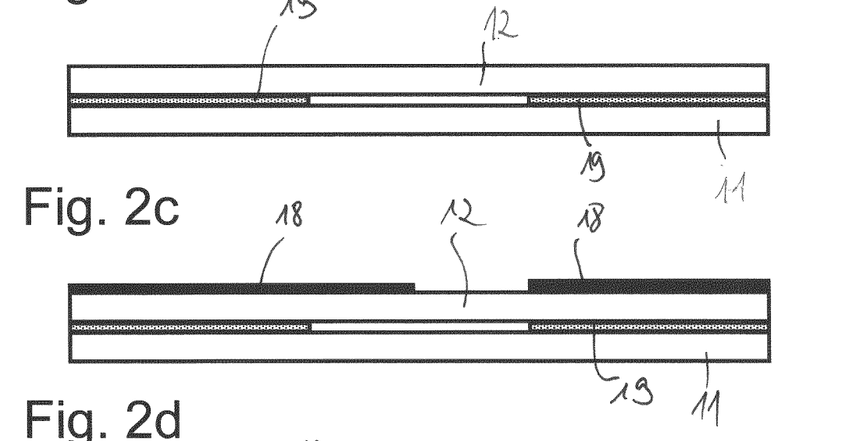
Figure 2E:
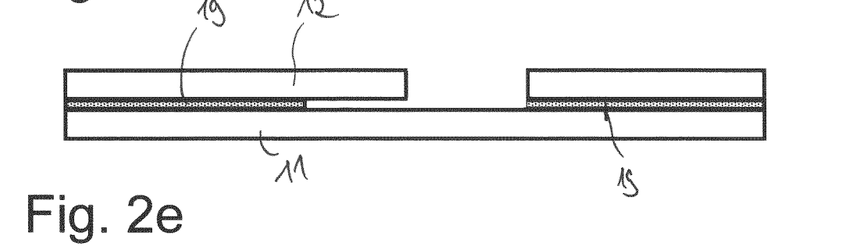
Figure 2F:
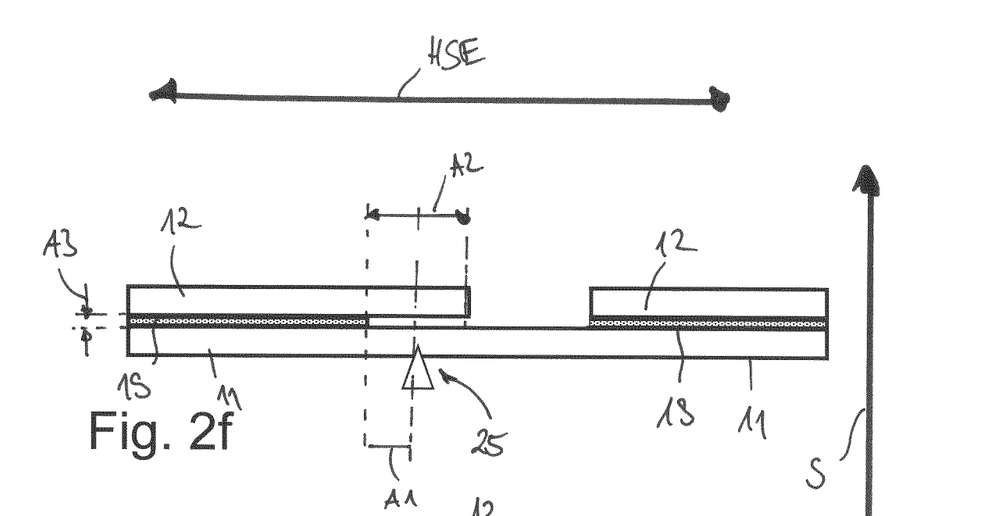
Figure 2G:
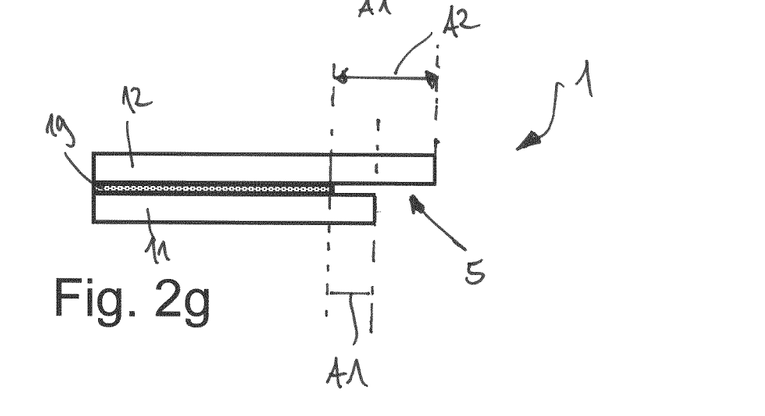

Furthermore, it is conceivable to arrange stop elements at the edge of the solder material to prevent the solder material 19 from running into the second region B2 during the bonding process in order to unintentionally realize a bond there between the metal layer 12 and the ceramic layer 11. The subsequent process steps of FIGS. 2e, 2f and 2g are substantially the same as those of FIGS. 1e, 1f and 1g and provide for the separation of the metal layer 12 and the ceramic layer 11 in the second region B2.

Furthermore, in a preferred embodiment, it is provided that the metal layer is etched prior to bonding over the solder material 19 or the buffer layer. In this way, a structuring can advantageously be carried out on the metal layer 12 which supports a suppression of the bonding in the second region B2. In particular, this makes it possible to prevent molten solder material 19 which has inadvertently reached the planned second region B from providing a bond there.

Alternatively and/or additionally, it is provided to realize a spacer and/or blocking element which prevents molten solder material 19 from inadvertently entering the planned second region B2 and thus realizing a connection in the second region B2 and/or reducing the size of the second region B2. In the form of the spacer, for example, it is ensured that a distance between the layers to be connected cannot be reduced. This prevents the solder material 19 from the first region B1 from being forced or squeezed into the second region B2 due to the layers 11, 12 otherwise moving towards each other to be joined via the solder material 19. Finally, without such a spacer, such movement towards each other of the layers to be joined would be expected, for example because of capillary forces occurring. In this regard, the spacer is configured to abut the metal layer 12 and the ceramic layer 11 on opposite sides thereof, respectively, thereby spacing the metal layer 12 and the ceramic layer 11 apart.

For example, a metal is used for forming the blocking element and/or spacer for this purpose, which does not melt at the prevailing temperatures during solder bonding. Furthermore, the metal can be used to implement a corresponding barrier and/or blocking or stop element that prevents solder material 19 from entering the intended second region B2. Preferably, the blocking element then extends along the boundary between the first region B1 and the second region B2 or is extended as a placeholder over the entire second region B2. In this regard, it is envisaged that the metal is selected such that it does not form an alloy with the solder material 19 or dissolve in the solder material during the soldering process.

REFERENCE LIST 1 metal-ceramic substrate
5 connection or terminal
11 ceramic layer
12 metal layer
17 recess
18 resist layer
19 solder material
25 predetermined breaking point
B1 first region
B2 second region
A1 first distance
A2 second distance
A3 third distance
A connecting surface
MD metal layer thickness
ÄT etching depth
HSE main extension plane
S stacking direction

The invention claimed is:

1. A method of manufacturing a metal-ceramic substrate (1) which, in the manufactured state, has a ceramic layer (11) and a metal layer (12) extending along a main extension plane (MPE) and being arranged one above the other along a stacking direction (S) extending perpendicularly to the main extension plane (MPE), comprising:
   providing the metal layer (12) with a thickness between 200 μm and 1000 μm and the ceramic layer (11) and bonding the metal layer (12) to the ceramic layer (11) region by region to form a first region (B1), which has a materially bonded connection between the metal layer (12) and the ceramic layer (11), and a second region (B2), in which the metal layer (12) and the ceramic layer (11) are arranged one above the other without a materially bonded connection, viewed in the stacking direction (S), characterized in that the second region (B2) is provided at least in regions as a connecting surface and/or as a terminal, characterized in that the second region (32) is obtained during a bonding process in that the metal layer (12) is only partially oxidized on an upper and/or lower side before the bonding process is carried out, regions remaining free from oxidation which is required in the bonding process for the formation of a eutectic and thus for the bond between the metal layer and the ceramic layer, and in that the metal layer (12) is structured after the bonding process in order to form conductor paths or connection.

2. The method according to claim 1, further comprising:
   separating the ceramic layer (11) in the second region (B2) at a first distance (A1) from the first region (B1) measured parallel to the main extension plane (MPE), and
   separating the metal layer (12) in the second region (B2) at a second distance (A2) from the first region (B1), which second distance is parallel to the main extension plane (MPE).

3. The method according to claim 2, wherein simultaneously with separating the metal layer (12) in the second region (B2), a structuring of the metal layer (12) is carried out.

4. The method according to claim 2, wherein, in order to form a metal section (5) which, in the manufactured state, projects with respect to the ceramic layer (11) in a direction parallel to the main extension plane (MPE) to form a terminal, the second distance (A2) is greater than the first distance (A1).

5. The method according to claim 2, wherein a predetermined breaking point (25) is realized for separating the ceramic layer (11).

6. The method according to claim 2, wherein an etching process is used to separate the metal layer (12).

7. The method according to claim 1, wherein the second region (B2) is an internal metal region of the metal layer (12).

8. The method according to claim 7, wherein the second region (B2) formed as an internal metal region is completely closed or has an opening.

9. The method according to claim 1, wherein a terminal is provided by bending up or upward the second region (B2).

* * * * *